United States Patent
Christensen et al.

(10) Patent No.: US 9,496,326 B1
(45) Date of Patent: Nov. 15, 2016

(54) HIGH-DENSITY INTEGRATED CIRCUIT VIA CAPACITOR

(71) Applicant: International Business Machines Corporation, Armonk, NY (US)

(72) Inventors: Todd A. Christensen, Rochester, MN (US); John E. Sheets, II, Zumbrota, MN (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 14/884,897

(22) Filed: Oct. 16, 2015

(51) Int. Cl.
*H01L 27/108* (2006.01)
*H01L 27/092* (2006.01)
*H01L 49/02* (2006.01)
*H01L 29/94* (2006.01)

(52) U.S. Cl.
CPC ......... *H01L 28/60* (2013.01); *H01L 27/10829* (2013.01); *H01L 29/945* (2013.01)

(58) Field of Classification Search
CPC H01L 27/10829; H01L 29/945; H01L 28/60
USPC .............. 257/301, 761, E21.396, E27.092; 438/243, 386
See application file for complete search history.

(56) References Cited

U.S. PATENT DOCUMENTS

| | | | |
|---|---|---|---|
| 5,055,966 A | 10/1991 | Smith et al. | |
| 6,320,244 B1 | 11/2001 | Alers et al. | |
| 6,963,483 B2 | 11/2005 | Chakravorty et al. | |
| 8,088,667 B2 | 1/2012 | DeNatale et al. | |
| 8,405,135 B2 | 3/2013 | Yang et al. | |
| 8,502,293 B2 | 8/2013 | Lindert | |
| 8,609,504 B2 | 12/2013 | Yang et al. | |
| 8,779,491 B2 | 7/2014 | Yang et al. | |
| 8,841,748 B2 | 9/2014 | Joblot et al. | |
| 2003/0168343 A1* | 9/2003 | Commander | C25D 3/38 205/123 |
| 2008/0089007 A1 | 4/2008 | Oladeji et al. | |
| 2008/0185681 A1 | 8/2008 | Halimaoui et al. | |
| 2009/0108403 A1 | 4/2009 | Gogoi | |
| 2014/0124943 A1 | 5/2014 | Behrends et al. | |
| 2014/0127875 A1 | 5/2014 | Behrends et al. | |
| 2014/0367828 A1 | 12/2014 | Colonna et al. | |
| 2015/0102464 A1 | 4/2015 | Kang et al. | |
| 2016/0148991 A1* | 5/2016 | Erickson | H01L 23/5222 438/381 |

OTHER PUBLICATIONS

Accelerated Examination Support Document, U.S. Appl. No. 14/977,953 signed Dec. 21, 2015, 7 pgs.
Christensen et al., "High-Density Integrated Circuit Via Capacitor," U.S. Appl. No. 14/977,953, filed Dec. 22, 2015.
List of IBM Patents or Patent Applications Treated as Related, Dec. 21, 2015, 2 pgs.

* cited by examiner

Primary Examiner — Long K Tran
(74) Attorney, Agent, or Firm — Nicholas D. Bowman

(57) ABSTRACT

A capacitor can be fabricated within an integrated circuit (IC) by creating, in a top surface of a dielectric layer of the IC, a recess having at least one side and a bottom, the bottom adjacent to a first conductive structure. A first plate of the capacitor may be formed by depositing a conductive liner onto the at least one side and the bottom of the recess. A conformal dielectric film may be deposited onto the first plate within the recess, and a second plate of the capacitor may be formed by filling a portion of the recess that is not filled by the conformal dielectric film with an electrically conductive material that is electrically insulated, by the conformal dielectric film, from the first plate.

12 Claims, 4 Drawing Sheets

HIGH-DENSITY INTEGRATED CIRCUIT VIA CAPACITOR

BACKGROUND

The present disclosure generally relates to an integrated circuit (IC) capacitor. In particular, this disclosure relates to a high-density capacitor formed within a dielectric layer of an IC.

A capacitor is a passive electrical component having at least two electrical conductors known as plates, separated by a dielectric or insulator, and which may be used to electrostatically store energy in an electric field. Capacitors may be useful as circuit elements in conjunction with a variety of types of electronic devices such as digital and analog ICs.

A decoupling capacitor can be used to decouple or electrically isolate one part of an electrical circuit or network from another part of the circuit. Electrical noise generated by certain circuit elements can be shunted through a decoupling capacitor. Decoupling capacitors can be particularly useful for shunting or bypassing high-frequency noise components around noise-sensitive circuitry such as filters, amplifiers and logic elements.

SUMMARY

Embodiments may be directed towards a method for fabricating, within an integrated circuit (IC), a capacitor. The method may include creating, in a top surface of a dielectric layer of the IC, a recess having at least one side and a bottom, the bottom adjacent to a first conductive structure. The method may also include forming a first plate of the capacitor by depositing a conductive liner onto the at least one side and the bottom of the recess. The method may also include depositing a conformal dielectric film onto the first plate within the recess and forming a second plate of the capacitor. The second plate of the capacitor can be formed by filling a portion of the recess that is not filled by the conformal dielectric film with an electrically conductive material that is electrically insulated, by the conformal dielectric film, from the first plate.

Embodiments may also be directed towards a capacitor, within a dielectric layer of, and for use with, an IC. The capacitor may include a first plate deposited onto at least one side and a bottom of a recess formed in a top surface of a dielectric layer of the IC and a conformal dielectric film attached to the first plate within the recess. The capacitor may also include a second plate, electrically conductive and formed within a portion of the recess that is not filled by the conformal dielectric film and that is electrically insulated from the first plate by the conformal dielectric film.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
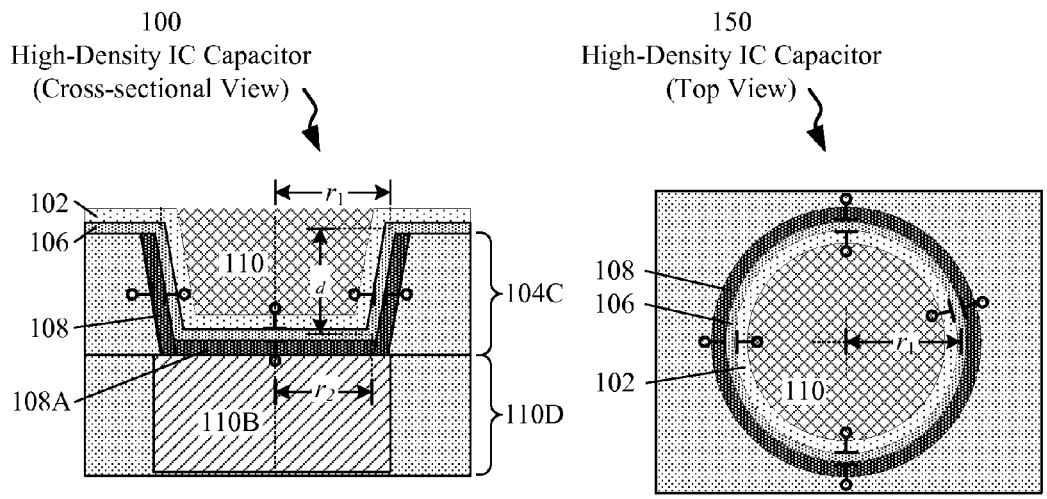
FIG. 1 includes consistent cross-sectional and top views of a high-density integrated circuit (IC) capacitor, including a first conductive structure, according to embodiments of the present disclosure.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

Certain embodiments of the present disclosure can be appreciated in the context of providing high-density capacitors useful as elements within particular types of circuits of an integrated circuit (IC) device. Such circuit types may include analog, filter, amplifier, clock and phase-locked loop (PLL) circuits. These types of circuits can be used to provide a variety of analog and digital signals having tightly controlled output signal values, frequency and skew/jitter characteristics to other circuits within the IC. Such ICs may include, but are not limited to analog, radio-frequency (RF) and mixed-signal ICs. While not necessarily limited thereto, embodiments discussed in this context can facilitate an understanding of various aspects of the disclosure. Certain embodiments may also be directed towards other equipment and associated applications, such as providing high-density capacitors for use in decoupling power supplies for particular noise-sensitive circuits, such as analog filters, amplifiers, converters and PLLs, within an IC. Such circuits may be used to provide frequency-dependent filtering and general signal amplification functions within an IC. Embodiments may also be directed towards providing high-density capacitors for use in decoupling power supply voltages for other types of ICs, such as application-specific integrated circuits (ASICs), microprocessors, logic, memory or mixed-signal ICs.

The precision or accuracy of the output of an analog circuit, for example, a circuit that amplifies or filters a voltage signal, may depend directly on the stability of a particular supply voltage rail within the IC. A high-density decoupling capacitor formed within an IC may be useful in stabilizing IC supply voltage rails for noise-sensitive circuits such as analog filters and amplifiers. In some applications, limitations imposed by IC pin count(s) and by the electrical parasitics of components external to an IC may make the connection of external decoupling capacitors to circuits within the IC impractical or ineffective. The values of electrical component parasitics, such as equivalent series resistance (ESR) and equivalent series inductance (ESL), of capacitors formed within an IC can be significantly smaller than the electrical parasitic values of capacitors located external to the IC. These reduced electrical parasitic values can cause capacitors formed within an IC to be significantly more effective in decoupling IC power rails than decoupling capacitors located external to the IC.

For ease of discussion, the term "high-density IC capacitor" may be used herein. This term can be used to refer to a capacitive structure, created according to embodiments of the present disclosure, within an IC, that has significantly higher capacitive density, i.e., capacitance per unit of physical area, than other types of capacitors which may be formed within an IC.

The term "conductive structure" may be used herein, referring to an electrical conductor, e.g., a wire or metal plane, formed within a metal layer of an IC. The conductive structure may be used to electrically connect a plate of a high-density capacitor to a signal, power supply or ground node(s) of circuits within the IC. In some embodiments, a conductive structure may be a metallic post, pillar or through-silicon via (TSV). It may be understood that a planar dielectric layer of an IC may include recesses or trenches used to contain conductors and/or capacitive structures within the dielectric layer. The terms "dielectric layer" and "metal layer" may therefore both be used in reference to a single physical layer structure containing both dielectric material and conductive material.

As IC device densities and IC active device switching speeds have increased, the need for local power supply decoupling capacitors and signal-capable IC capacitors having high capacitive density continues to grow. The effectiveness of capacitors located external to an IC may be limited by electrical parasitics such as ESR and ESL, and other limitations such as IC pin count.

An IC capacitor can be formed by using field-effect transistor (FET) gates, parallel plate structures, e.g., metal layers insulated by dielectric layers, semiconductor diffusion areas and other types of IC structures. An IC capacitor formed, for example, in an isolated diffusion layer or moat of an IC, may include terminals, connected to each plate of the capacitor that facilitate electrical connections to other circuit elements within the IC. Such capacitors may yield relatively small capacitance values, relative to other types of IC capacitors. Parasitic ESR, resulting from certain types of diffusion capacitor plate connections can reduce the effective capacitance value of a diffusion capacitor. IC diffusion layer capacitors may have relatively low capacitive density and can be difficult to connect to other circuit elements within an IC. IC diffusion area capacitors may consume large amounts of semiconductor area in regions which may be populated with active devices such as transistors. Such capacitors may be implemented with increased physical dimensions to offset large dimensional tolerances. The ongoing trends of shrinking transistor sizes, vertical field-effect transistors, e.g., FinFETs, and other semiconductor area constraints, make capacitors such as diffusion area capacitors relatively costly with respect to the semiconductor area they may consume.

According to embodiments, a high-density IC capacitor may provide a large amount of capacitance in close proximity to active electronic devices within an IC. A high-density IC capacitor can be formed within an existing IC via recess, providing a high capacitive density per unit of dielectric layer area. A high-density IC capacitor may be useful for inclusion as an element within circuits of the IC, and may also be useful, either individually or in interconnected groups, as a decoupling capacitor within the IC. Electrical interconnect structures such as wires and vias formed within the IC may be used, in conjunction with a high-density IC capacitor, to interconnect the capacitor to power, ground or signal nodes within the IC. Such interconnect structures can limit the electrical parasitics, such as ESR and ESL, of a high-density IC capacitor, which can cause the capacitor to be significantly more effective as a power supply decoupling or circuit element. According to embodiments, a high-density IC capacitor can be fabricated within an existing dielectric layer of an IC, using existing and proven IC processes and material sets, and may be useful by making efficient use of otherwise unpopulated areas of an IC dielectric layer.

Certain figures herein show only a single high-density capacitor, however, embodiments may include a plurality of high-density capacitors, and/or a plurality of planar dielectric layers, each layer containing one or more high-density capacitors. In some embodiments, multiple high-density capacitors may be electrically interconnected for the creation of capacitors having larger cumulative capacitance values, which may be useful for decoupling power supply rails of the IC. While all figures herein illustrate the principles and features of the present disclosure, they are not necessarily drawn to scale.

Certain embodiments relate to the fabrication of a high-density capacitor within a dielectric layer of an IC. FIG. 1 includes cross-sectional view 100 and consistent top view 150, of a high-density IC capacitor fabricated within dielectric layer 104C of an IC, including a first conductive structure 110B formed within metal layer 110D, according to embodiments of the present disclosure. According to embodiments of the present disclosure, capacitor 100 includes a conformal dielectric film 106 formed, and providing electrical insulation, between a first plate formed from a conductive liner 108/108A and a second plate formed from electrically conductive material 110. In embodiments, capacitor 100 can be generally used as a circuit element within the IC. The high surface area of conductive liner 108/108A and conductive material 110, in conjunction with the high dielectric constant and low thickness of conformal dielectric film 106, can result in capacitor 100 having a relatively high capacitance per unit of dielectric layer area.

Conformal dielectric film 106 is useful in facilitating physical attachment of the second plate 110 to the first plate 108. The capacitance of capacitor 100 is substantially determined by the surface area of the first plate 108 that is separated, by the conformal dielectric film 106, from corresponding surface area of the second plate 110. In some embodiments, conductive structures such as vias or wires may be fabricated from an electrically conductive material, e.g., copper, cobalt, tungsten, aluminum or titanium, and used to connect plates 108 and 110 of capacitor 100 to additional electrical conductors and circuit elements within the IC.

The embodiment depicted in FIG. 1 includes the high-density capacitor 100 created within a recess formed within dielectric layer 104C. In some embodiments, the dimensions of such a recess can be consistent with dimensions of recesses used to form vias to interconnect stacked conductive layers within the IC. In other embodiments, the dimensions of such a recess can be appreciably larger or smaller than recesses used to form interconnect vias within the IC.

According to embodiments, a number of physical and electrical parameters can each influence the capacitance value of a high-density capacitor, which can cause it to be greater than the capacitance value of other types of IC capacitors. These parameters include, but are not limited to, capacitor plate area, the thickness of the dielectric layer and the dielectric constant of the dielectric layer.

In general, the capacitance of a "parallel plate" capacitor having a conductive plate area A and plate separation t is determined in accordance with the following equation:

$$C = \varepsilon \times \frac{A}{t} = k\varepsilon_0 \times \frac{A}{t}$$

Where:
C=capacitance (farad or Coulomb/Volt)
∈=the relative permittivity of the dielectric material used in the capacitor
A=plate area of the capacitive element (m$^2$)
t=distance between the plates or dielectric thickness (m)
k=relative permittivity of the dielectric material between the plates
 (k=1 for free space, k≈1 for air, k>1 for all other media)
∈$_0$=permittivity of free space=8.854×10$^{-12}$ F/m (farads per meter)

Figure 3:
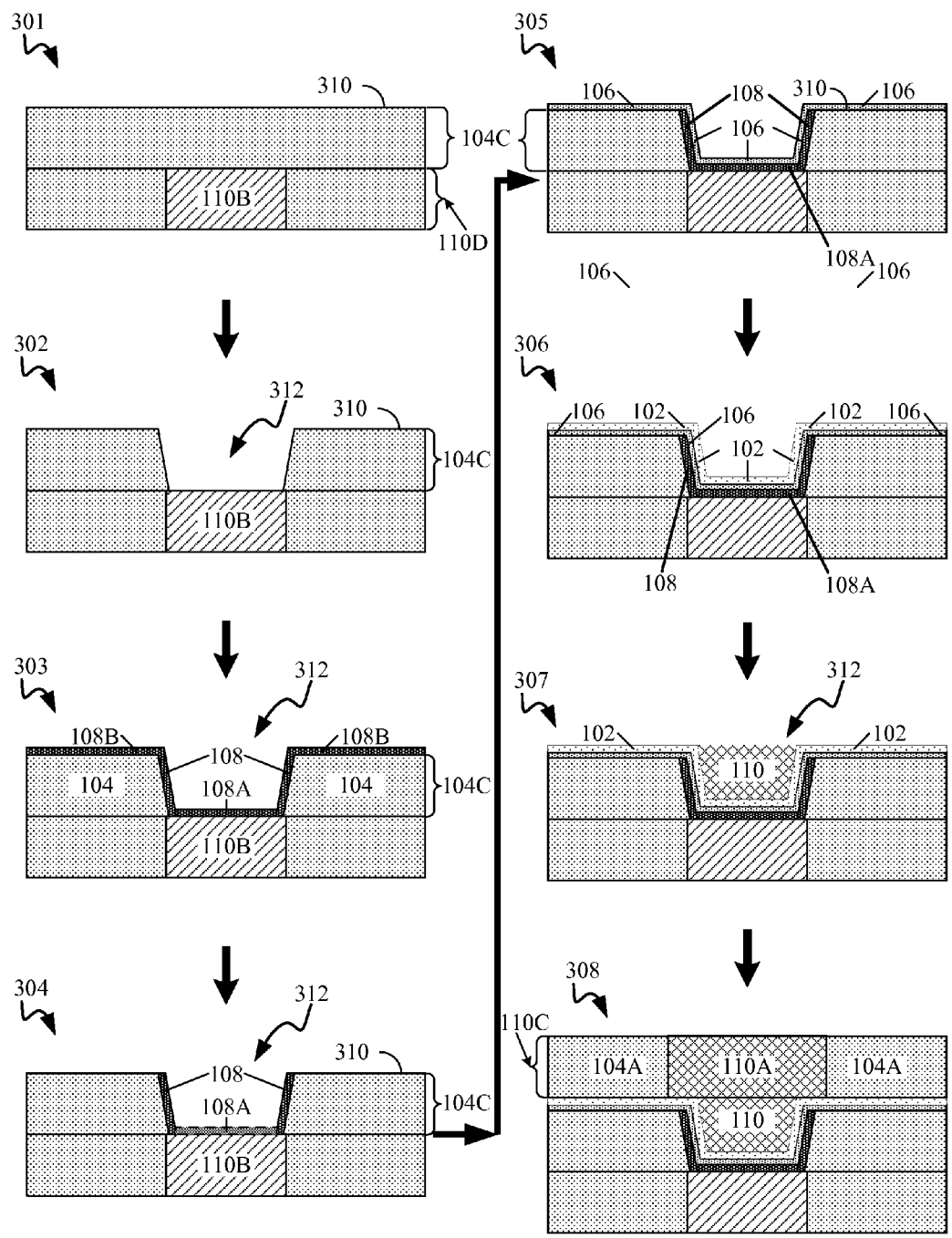
FIG. 3 includes a set of eight consistent cross-sectional views illustrating the results of process operations for fabricating a high-density IC capacitor, according to embodiments consistent with the figures.

In some embodiments of the present disclosure, in accordance with the characteristics of certain IC dielectric material etch processes, the shape of a dielectric layer recess, and thus the high-density capacitor formed in the recess can be consistent with the shape of a conical frustum, as depicted in FIG. 1 and view 302, FIG. 3. The conductive plate area A of a conical frustum-shaped high-density IC capacitor is determined in accordance with the following equation:

$$A = \pi(r_1 + r_2)\sqrt{(r_1 - r_2)^2 + d^2} + \pi(r_2)^2$$

Where:
A=plate area of the first/second plates (m$^2$)
$r_1$=the larger top recess radius (m) (FIG. 1)
$r_2$=the smaller bottom recess radius (m) (FIG. 1)
d=recess depth (m) (FIG. 1)

The equation above includes the total capacitor area as a sum of the area of the curved perimeter surface plus the area of the bottom of the first conductive liner 108, FIG. 1.

In some embodiments, a high-density capacitor can have a non-conical shape, such as cylindrical, polygonal or irregular. In such embodiments, the total plate area A of the capacitor can be calculated similarly to the method described above, however, different equation(s) can be used. For example, the conductive plate area A of a high-density IC capacitor having a generally cylindrical shape is determined by the following equation:

$$A = d*2\pi r + \pi r^2$$

Where:
A=plate area of the first/second plates (m$^2$)
d=recess depth (m) (view 100, FIG. 1)
r=recess radius (m) (view 100, FIG. 1)

The plate area A of an example high-density IC capacitor can be calculated by inserting the following parameter values into the conical frustum area formula:

$r_1$=35 nm, $r_2$=25 nm, and d=500 nm, resulting in:

plate area A=47,614 nm$^2$

By way of comparison, the plate area A of a parallel plate capacitor, occupying the same IC dielectric layer area as a high-density IC capacitor can be calculated as follows:

plate area A=plate width*plate length=50 nm*50 nm=2,500 nm$^2$

The ratio ΔA of plate area A of a high-density IC capacitor to the plate area A of a parallel plate capacitor occupying the same IC dielectric layer area can therefore be calculated as:

ΔA=47,614 nm$^2$/2,500 nm$^2$=19.0

Referring to the equations above, the relative permittivity of conformal dielectric film 102 can be the relative permittivity, for example, of a deposited film of HfO$_2$. A conformal dielectric film 102 of HfO$_2$ can have a relative permittivity or dielectric constant k of approximately 28. By contrast, the dielectric constant k, for example, of a layer of SiO$_2$ can be approximately 3.9.

The ratio of dielectric constant k of a high-density IC capacitor to dielectric constant k of a parallel plate IC capacitor the can therefore be calculated as:

Δk=28/3.9=7.2

According to embodiments, as described above, the values of ΔA and Δk can have a significant effect on the capacitance and capacitive density of a high-density IC capacitor. The increased plate area A, in conjunction with increased dielectric constant k of dielectric film 106 can be used to create IC capacitors having very high capacitive values and capacitive densities.

The parameter value differences ΔA and Δk, as calculated above, can be multiplied together to calculate an estimated difference in capacitance between a high-density IC capacitor and a parallel plate IC capacitor occupying approximately the same area within a dielectric layer. For example:

ΔC=ΔA*Δk

Where:
ΔC=ratio of capacitance (high-density capacitor:parallel plate capacitor)
ΔA=plate area ratio (high-density capacitor:parallel plate capacitor)
Δk=dielectric constant ratio (high-density capacitor:parallel plate capacitor)

Using the values calculated above, ΔA=19.0 and Δk=7.2 results in a ΔC, or capacitance ratio between a high-density capacitor and a parallel plate capacitor of 136.8.

The calculations herein are example calculations, and actual values of ΔC can vary, based upon particular values of ΔA and Δk. However, the above calculations serve to indicate that substantial increases in both capacitance and capacitive density can be achieved through the use of a high-density IC capacitor fabricated according to embodiments of the present disclosure.

Continuing with the example from above, the capacitance of a high-density IC capacitor can be calculated as follows:

$$C = k\varepsilon_0 \times \frac{A}{t}$$

Where:
C=capacitance (farad or Coulomb/Volt)
k=relative permittivity of the dielectric film between the plates (k=28 for HfO$_2$)
∈$_0$=permittivity of free space=8.854×10$^{-12}$ F/m (farads per meter)

A=plate area of the capacitive element, previously calculated as 47,614 nm$^2$ t=distance between the plates or dielectric thickness=4 nm Solving the above equation using the previously listed parameters yields a nominal a capacitance value of ≈20 fF. A capacitor with these dimensions can be placed, in an IC dielectric layer, at a 50 nm periodicity, so for this example, 400 such capacitors can be placed per 1 um$^2$ of IC dielectric area. Such an arrangement can yield a capacitance of approximately 7.8 pF/um$^2$ or 7.8 uF/mm$^2$ of IC dielectric area.

A variety of physical dimensions, e.g., diameter, depth and conformal dielectric film thickness, and material properties, e.g., a conformal film dielectric constant, can be specified, in embodiments, to create IC capacitors having a wide range of capacitance values. For example, in certain applications, embodiments of high-density IC capacitors useful in the design and fabrication of analog circuits can have capacitance in a range from approximately 50 fF to approximately 0.5 pF.

Various embodiments of the present disclosure relate to capacitors designed and fabricated within a single IC dielectric layer, or insulating plane. Efficient use of IC dielectric layer area can result from the formation of one or more small-footprint, high-density capacitor(s) within a dielectric layer that can be otherwise sparsely populated with interconnect via structures. Such high-density capacitor formation can result in conservation of both active circuit area and electrical interconnect area within back-end-of-line (BEOL) dielectric layers of an IC design. Use of dielectric plane(s) near the top of an IC's dielectric and metal plane "stack" can result in reduced vertical wiring, i.e., vias, to connect high-density IC capacitor(s) to other conductors and/or active devices, and may reduce wiring congestion near the active devices. The implementation of high-density capacitor(s) within an IC can be useful for conserving IC active circuit area and allowing an IC design to include a greater number of active devices and interconnecting wires than an IC design without high-density capacitors.

In embodiments, high-density capacitors can be created by using existing and proven materials, design techniques and semiconductor fabrication technologies. According to embodiments, an IC constructed with a dielectric layer including high-density capacitors can be compliant with existing and proven IC manufacturing processes and material sets. Fabricating high-density capacitors within dielectric layers of an IC can be particularly useful as a cost-effective way to add electrically accessible, high-density capacitors to new or existing IC designs. An IC constructed according to embodiments of the present disclosure can be configured to be customizable relatively late in an IC fabrication process, through the adding, removing or rearranging the orientation of electrical conductors to the capacitors. These operations can be substantially less complicated than customizing capacitors formed at the semiconductor device or diffusion level, and can make an IC including these capacitors useful and versatile. Certain embodiments can be particularly useful by using aspects of known fabrication processes to create a high-density capacitor, which can facilitate low cost, reliable solutions not requiring substantial development time, effort or expense to implement.

Figure 1A:
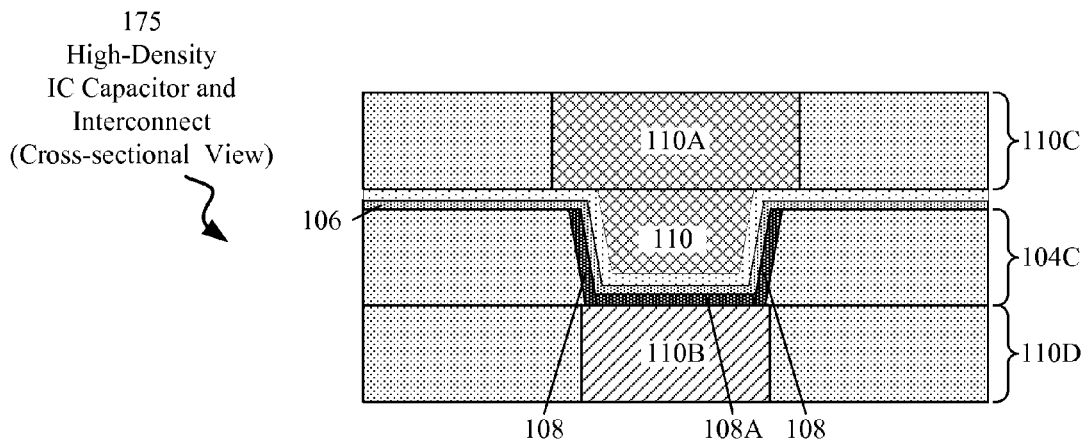
FIG. 1A is a cross-sectional view of a high-density IC capacitor, including a second conductive structure, according to embodiments consistent with the figures.

FIG. 1A is a cross-sectional view of a high-density IC capacitor 175, including a second conductive structure 110A formed within a metal layer 110C of an IC, according to embodiments consistent with the figures. According to embodiments, first conductive structure 110B, formed within metal layer 110D, and second conductive structure 110A can be used to electrically interconnect the first plate 108/108A and the second plate 110, respectively, of the high-density IC capacitor, formed within dielectric layer 104C, to other circuit nodes within the IC. Other circuit nodes within the IC can include, but are not limited to, power, e.g., $V_{DD}$, ground, analog signal nodes and digital signal nodes. In some embodiments, conductive structures such as 110A and 110B can be useful for interconnecting a number of high-density IC capacitors to create a capacitive network having a high capacitance value, which can be useful for decoupling power supply nodes of the IC. In some embodiments, high-density IC capacitors can be fabricated in a regular array or other type of close arrangement, within a dielectric layer of an IC, which can promote efficient use of IC dielectric layer area and reduction of capacitor parasitics such as ESR and ESL.

In certain embodiments, a high-density capacitor can be utilized for decoupling power supply voltages, and in certain embodiments can be used in conjunction with other electrical signal types. A high-density IC capacitor can be used with electrical signals having an unknown polarity, within a voltage range that does not exceed a specified dielectric breakdown and/or leakage voltage of the conformal dielectric film, e.g., 106.

Figure 1B:
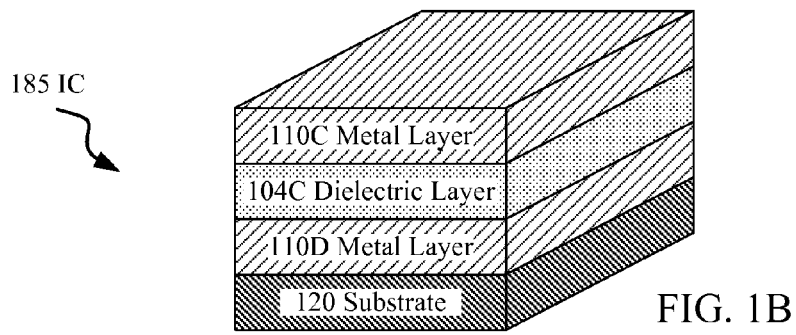
FIG. 1B is an isometric drawing of an IC, including a substrate, two metal layers and a dielectric layer, according to embodiments consistent with the figures.

FIG. 1B is an isometric drawing of an IC 185, including a substrate 120, two metal layers 110C, 110D and a dielectric layer 104C, according to embodiments consistent with the figures. The substrate 120 can be a thin slice of semiconductor material, such as a silicon crystal, used in the fabrication of ICs, and can have microelectronic devices, such as transistors, fabricated within it.

Metal layer 110D can be formed on the top or active device surface of substrate 120, and can include conductive structures, such as wires, separated by dielectric material. Dielectric layer 104C can be used to provide electrical insulation between conductive structures formed in metal layers 110D and 110C. According to embodiments, high-density IC capacitor structures can be fabricated within dielectric layer 104C, consistent with layers depicted in FIG. 1, FIG. 1A and FIG. 3.

FIG. 1, FIG. 1A and FIG. 1B illustrate an example embodiment of an IC. Some embodiments may include additional dielectric and metal layers similar to dielectric layer 104C and metal layers 110C and 110D, respectively, formed in a stacked, planar arrangement on top of a substrate, e.g., 120. According to embodiments, high-density IC capacitors can be fabricated within each of a number of dielectric layers such as 104C, located above a semiconductor layer of an IC, that has a metal layer disposed above and beneath it.

Figure 2:
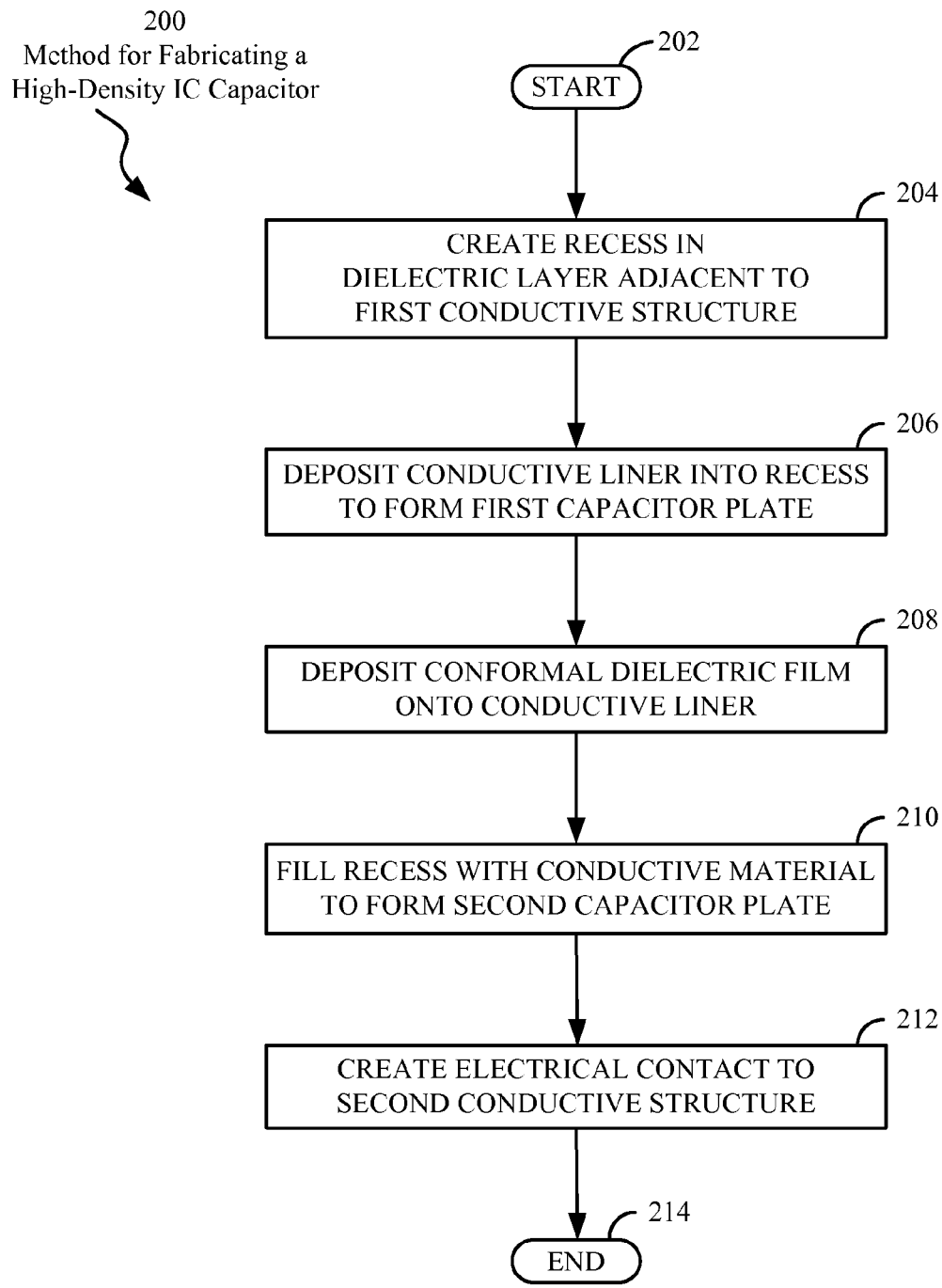
FIG. 2 is a flow diagram illustrating a method for fabricating a high-density IC capacitor, according to embodiments consistent with the figures.

FIG. 2 is a flow diagram illustrating a method 200 for fabricating, within an IC, a high-density IC capacitor, according to embodiments consistent with the figures. The method for fabricating a high-density IC capacitor 200 can be useful for creating a capacitor that has a relatively high capacitive density per unit of chip dielectric layer area, and that is compatible with existing IC material sets and fabrication technologies. The operations described herein in reference to the method 200 correspond to the views 301-308, FIG. 3, and their associated descriptions.

The process 200 moves from start 202 to operation 204. Operation 204 generally refers to the operation(s) that involve creating a recess in a top surface of a dielectric layer of an IC, which may correspond to the views 301, 302, FIG. 3, and their associated descriptions. A recess created through an etching process includes at least one side and a bottom, which may be useful as a location to form a first plate of the high-density capacitor.

Dimensions of the recess, including width/diameter, length and depth, may be calculated and specified in order to create a capacitor structure having a specified target capacitance value. In some embodiments, dimensions of the recess can be consistent with dimensions of a recess used to create a via for interconnecting conductive layers within an IC. According to embodiments, the dielectric layer is etched to expose a first electrically conductive connector structure at the bottom of the recess. Once a recess has been created in the top surface of the dielectric layer, the process moves to operation 206.

Operation 206 generally refers to operation(s) that involve depositing a first conductive liner into the recess formed in operation 204, in order to form a first capacitor plate, corresponding to the views 303, 304, FIG. 3, and their associated descriptions. According to embodiments, the first conductive liner is deposited onto the side(s) and bottom of the recess, which is useful for creating an electrical connection between the first electrically conductive connector structure and the first conductive liner/plate. Creating an electrical connection can be useful for connecting a high-density capacitor to a power, ground or signal node within the IC.

According to embodiments, process(es) used to deposit the first conductive liner/plate can be consistent with processes used to deposit conductive material within metal layers of an IC. Similarly, materials, e.g., various metals, used to create the first conductive liner can be consistent with metals used to line cavities of electrical interconnect structures, such as vias, within an IC. According to process operations used in IC fabrication, photolithographic techniques involving the use of photomasks and photoresist can be employed in operation 206 in order to restrict an area for the deposition of the first conductive liner.

In some embodiments, a portion of the first conductive liner that is deposited, during operation 206, on the top surface of the dielectric layer may be subsequently removed, for example through an etching or polishing process. Removal of a portion of the first conductive liner from the top surface of the dielectric layer can be useful for electrically insulating a remaining portion of the first conductive liner from adjacent capacitors and/or electrically conductive structures such as wires and vias. Once the conductive liner has been deposited into the recess, the process moves to operation 208.

Operation 208 generally refers to operation(s) that involve depositing a conformal dielectric film onto the first conductive liner or plate, which can correspond to view 305, FIG. 3, and its associated description. Depositing a conformal dielectric film into the recess creates a dielectric layer, which can be useful for providing electrical insulation between the plates of a high-density capacitor structure. A conformal dielectric film that has a relatively high dielectric constant can enable creation of a capacitor having a significantly higher capacitance value than that of a capacitor created with other types of dielectric films. According to embodiments, a conformal dielectric film can provide a surface on which to subsequently form and attach a second plate of the capacitor. Once the conformal dielectric film is deposited onto the first conductive liner, the process moves to operation 210.

Operation 210 generally refers to the process operation(s) that involve filling the recess with conductive material to form a second capacitor plate, which can correspond to the views 306, 307, FIG. 3, and their associated descriptions.

According to embodiments, a second plate of the capacitor can be formed by filling a portion of the recess that is not filled by the conformal dielectric film with an electrically conductive material, e.g., metal, that is electrically insulated from the first plate by the conformal dielectric film deposited in operation 208. In some embodiments, a second conductive liner is deposited on a top surface of the dielectric layer prior to filling the recess with a conductive material. A second conductive liner can be useful in providing a surface on which to subsequently attach electrically conductive material to complete the formation of a second plate of the capacitor.

Consistent with operation 206, the second plate can be created using conductive material deposition process(es), including photolithographic operations and materials consistent with processes and materials used in creating conductive structures within ICs. In some embodiments, an IC capacitor includes more than one set of plates formed in more than one recess.

In some embodiments, following filling the recess with an electrically conductive material, the top surface of the electrically conductive material can be polished or planarized using, for example, a chemical-mechanical polishing (CMP) process. Polishing or etching the electrically conductive material can be useful in providing a substantially planar top surface, which can facilitate subsequent IC processing operations such as deposition of dielectric and metal layers. Once the recess is filled with conductive material, the process moves to operation 212.

Operation 212 generally refers to the process operation(s) that involve creating an electrical connection between the second plate of the capacitor and a second electrically conductive connector structure, which corresponds to view 308, FIG. 3, and its associated description. Creating a second electrically conductive connector structure can involve depositing or growing a layer of dielectric material on a top surface of the second plate of the capacitor. Creating the second connector structure can also involve etching the dielectric material to create a via opening or trench, and depositing metal within the via opening to create an electrically conductive interconnect to the second plate.

Creating an electrical connection to the second plate can be useful for connecting the high-density capacitor to a power, ground or signal node within the IC. In some embodiments, multiple high-density capacitors formed within a region can be locally connected together by electrically conductive structures. Such connections can be useful, for example, to create high-density capacitor structures having high capacitance values useful for decoupling power rails within an IC. Once electrical contact is made to the second electrically conductive connector structure, the process 200 may end at block 214.

FIG. 3 includes a set of eight consistent cross-sectional views 301-308 depicting the results of a set of process operations for fabricating a high-density IC capacitor within a dielectric layer 104C of an IC, according to embodiments consistent with the figures. These views illustrate an example process; other views and operations can be possible. A high-density capacitor formed by these process operations can be consistent with capacitor 100, FIG. 1, and can have a high capacitive density per unit of chip dielectric surface area.

The progression depicted in views 301-308 begins with a dielectric layer 104C disposed on top of a metal layer 110D of an IC, view 301, and ends with a completed high-density IC capacitor in view 308. Process operations can be completed within structural layers which can be presently used for IC fabrication, such as metal layer 110D and dielectric layer 104C. A high-density capacitor fabricated using these process operations can be a particularly useful component when incorporated into circuits within an IC. Connector structures such as 110B, view 301, and 110A, view 308, can be formed to electrically connect the plates of the high-density capacitor to other circuit elements and/or nodes within the IC, such as power, ground and signal nodes.

The results of one or more process operations may be depicted in each view. For example, a view can depict the results of an etching process, which can also include photomask operations (apply, expose, develop, remove) that support the etching process. Processing operations associated with views 301-308 can include, but are not limited to etching, material layer deposition, layer planarization/polishing, photolithographic masking processes and insulator/oxide growth or deposition.

Completed structures may be generally shown in views 301-308 as having rectangular cross-sectional profiles, with surfaces orthogonal to each other. This depiction, however, is not limiting; structures can be of any suitable shape, size and profile, in accordance with specific design criteria, lithographic and manufacturing process limitations and tolerances for a given application. For example, corners shown as having right angles can be rounded, surfaces can have a non-orthogonal relative orientation, and relative dimensional ratios can vary from those depicted in the figures.

The relatively high permittivity values of various dielectric materials such as $HfO_2$ or $Si_3N_4$ can make these materials useful in the fabrication of high-density IC capacitors. It can be understood that some level of material or chemical impurities may exist as a result of the use of a process designed to deposit or form a certain type of material, such as a dielectric layer. For example, in a process operation designed to deposit $HfO_2$, it can be appreciated that the material actually deposited may be substantially $HfO_2$, although some small amount of impurities can also be included, as an unintended result of the deposition process.

The views 301-308 can be useful in illustrating details involved in creating an IC capacitor that has capacitive density greater than capacitive densities achievable through the creation of other capacitive structures. The operations depicted in the views 301-308 involve IC layers located above a semiconductor substrate, and such operations can be included in a BEOL fabrication process for an IC.

View 301 depicts a dielectric layer 104C and a metal layer 110D of an IC, prior to completion of any processing operations used to form a high-density IC capacitor. Metal layer 110D can be consistent with IC metal layers used for interconnecting active devices, e.g., transistors, and dielectric layer 104C can be consistent with IC dielectric layers used to provide electrical insulation between IC metal layers. Metal layer 110D can be formed onto a substrate layer of the IC, e.g., 120, FIG. 1B, and can include electrically conductive materials such as copper, cobalt, tungsten, aluminum or titanium. Dielectric layer 104C can be formed onto a metal layer, e.g., 110D, and can include electrically insulative materials such as Sift. In certain embodiments, connector structure 110B within metal layer 110D can be a portion of a wire used to interconnect circuit elements such as FETs. In some embodiments, connector structure 110B can be a region of metal designated solely for use in establishing an electrical connection to a high-density capacitor.

View 302 depicts the results of creating a recess 312 in a top surface 310 of a dielectric layer 104C of an IC. According to embodiments, recess 312 has at least one side and a bottom, the bottom located adjacent to a first electrically conductive structure 110B. In embodiments, the recess 312 can have a variety of outline shapes, as viewed from a top view, e.g., 150, FIG. 1, such as round, square, rectangular or other polygonal shapes. In some embodiments, the recess sides can be oriented substantially orthogonal to a dielectric layer top surface, and in other embodiments, the sides can be sloped relative to the top surface of the dielectric layer 104C, according to a type of etch process used to form the recess. Creating a recess 312, in which to form a high-density capacitor, in a dielectric layer region that is not populated with interconnecting vias can result in efficient use of dielectric surface area within an IC.

The operation of creating the recess 312 in dielectric layer 104C can include the use of etching processes consistent with processes used for via formation in an IC dielectric layer, including dry etching, plasma etching, anisotropic etching or reactive ion etching (RIE). In embodiments, creating the recess 312 can involve applying a photomask to define recess boundaries, exposing and developing lines in the photoresist, etching the recess 312 in the dielectric layer 104C, and stripping off the remaining photomask. According to embodiments, the dimensions of the recess 312 can be consistent with dimensions of vias used in electrical interconnections between metal layers within an IC.

View 303 depicts the results of depositing a first conductive liner 108/108A onto at least one side and the bottom of the recess 312 to form a first capacitor plate. A first conductive liner 108/108A can be useful in promoting adhesion of the conformal dielectric film 106, view 305, to dielectric layer 104C, and can also mitigate the diffusion of electrically conductive material 110, e.g., metal, into the dielectric material 104. In embodiments, the first conductive liner 108/108A deposited within the recess 312 can have a greater surface area than a corresponding parallel plate capacitor created within the same surface area of a dielectric layer. This increased surface area can be useful in increasing the capacitance and capacitive density of capacitors created according to embodiments. Depositing a first conductive liner 108/108A into the recess 312 can be useful for creating an electrical connection between the first connector structure 110B and the first conductive liner 108/108A.

The operation of depositing a first conductive liner 108/108A into at least one side and the bottom of the recess 312 can include the use of processes consistent with processes used for metal deposition in an IC metal layer, including a physical vapor deposition (PVD) process, cathodic arc deposition, or a chemical vapor deposition (CVD) process. According to embodiments, the first conductive liner 108/108A can include electrically conductive material, such as TiN, which can have a substantially uniform thickness when deposited onto at least one side and the bottom of the recess 312. In some embodiments, first conductive liner 108B can also be deposited on the top surface of dielectric layer 104C during operation 303.

View 304 depicts the results of removing a portion 108B of the first conductive liner that was deposited onto a top surface 310 of the dielectric layer 104C during operation 303. Removing portion 108B of the first conductive liner can be useful for electrically insulating nearby conductive electrical structure such as wires, vias, and other capacitors formed within dielectric layer 104C.

In some embodiments, the portion 108B of the first conductive liner deposited on a top surface 310 of the dielectric layer 104C can be removed through a CMP operation, and in some embodiments can be removed through an etching operation such as an anisotropic etch.

In some embodiments, a photoresist material, not depicted, can be used to fill at least a portion of the recess 312 prior to a polishing or etching operation used to remove a portion 108B of the first conductive liner. Filling the recess with a photomask material can be useful in facilitating the cleaning or eliminating the cleaning of residue resulting from the polish/etch operation from the recess 312. A photoresist layer, can be applied to fill the recess in the dielectric layer by using a process such as spin coating, spray, or extrusion coating. In some embodiments, a portion 108A of the first conductive liner deposited onto the bottom of the recess can be removed, for example, through the use of an anisotropic etch process. At the conclusion of the operations depicted in view 304, portion 108 of the first conductive liner remains attached to the dielectric layer 104C.

View 305 depicts the results of depositing a conformal dielectric film 106 onto the first conductive liner 108/108A. Conformal dielectric film 106 materials can include $Si_3N_4$ and $HfO_2$, which can have a relatively high dielectric constant, for example, between 7.5 and 28. Such materials can be useful for providing increased capacitance values for high-density capacitors, relative to capacitors created with lower dielectric constants. For example, $HfO_2$, having a relatively high dielectric constant or k≈28, can enable, in conjunction with higher plate surface areas of high-density capacitor structures, a high-density capacitor to have a significantly higher capacitance value than one created with a dielectric film such as $SiO_2$, with a k≈3.9.

The operation of depositing a conformal dielectric film 106 onto the first conductive liner 108 can include the use of deposition processes consistent with processes used for conformal film deposition in an IC, including plasma oxidation, CVD, or a variant such as plasma-enhanced chemical vapor deposition (PECVD). In some embodiments, a photolithographic process can also be used to define suitable areas for conformal film deposition. In some embodiments, the conformal dielectric film can also be deposited on a top surface 310 of a dielectric layer 104C.

View 306 depicts the results of depositing a second conductive liner 102 onto the conformal dielectric film 106 to form a second plate of the capacitor. The operation of depositing a second conductive liner 102 can include the use of processes consistent with processes used for metal deposition in an IC metal layer, including a PVD process, cathodic arc deposition, or a CVD process. According to embodiments, the second conductive liner 102 can include electrically conductive material, i.e., metals, such as TiN. In some embodiments, depositing the second conductive liner 102 can be useful to control or prevent diffusion of electrically conductive material 110, view 307, e.g., copper, into conformal dielectric film 106 and to promote adhesion of electrically conductive material 110 to the second conductive liner 102.

View 307 depicts the results of filling a portion of the recess 312 that is not filled by the conformal dielectric film 106 with electrically conductive material 110 to form a second plate of the capacitor. According to embodiments, conductive material 110 is electrically insulated, by the conformal dielectric film 106, from the first conductive liner/plate 108.

The operation of filling the recess 312 with electrically conductive material 110 can include the use of processes consistent with processes used for metal deposition in an IC metal layer, including a PVD process, cathodic arc deposition, or a CVD process. According to embodiments, the electrically conductive material 110 is electrically connected to the second conductive liner 102 created in operation 306.

In some embodiments, following a filling of the recess 312, a polish or etch operation can be used in order to planarize or level the top surface of the capacitive structure prior to operation 308. This planarization or leveling operation can include a CMP process, or other subtractive process such as milling, machining, or laser ablation. The planarization process can be useful in achieving a uniform specified flatness across the top surface of the electrically conductive material 110, in accordance with IC manufacturing tolerances and specifications.

In certain embodiments, a CMP process can be employed to partially planarize the top surface of the capacitive structure, in conjunction with a subsequent "wet", or chemical, etch process to complete the deposited material removal. Use of CMP planarization followed by wet etching can be useful for reducing possible chemical contamination of metal and dielectric material layers through the use of a CMP process alone.

View 308 depicts the results of creating a second electrically conductive connector structure 110A, within a metal layer 110C, in conductive contact with electrically conductive material 110. The electrically conductive material 110A can be useful to form electrical contact with electrically conductive material/second plate 110, in order to connect it to circuits and/or nodes within an IC.

Creating a second electrically conductive connector structure 110A can involve subsequent fabrication operations including, but not limited to, depositing or growing a layer of dielectric material 110C, such as $SiO_2$, on a top surface of the second plate 110 of the capacitor. Creating the second connector structure 110A can also involve etching the dielectric material 104A to create a via opening or trench, and depositing a conductive material, such as metal, within the via opening to create an electrically conductive connector structure 110A to the second plate 110 of the high-density IC capacitor.

Figure 4:
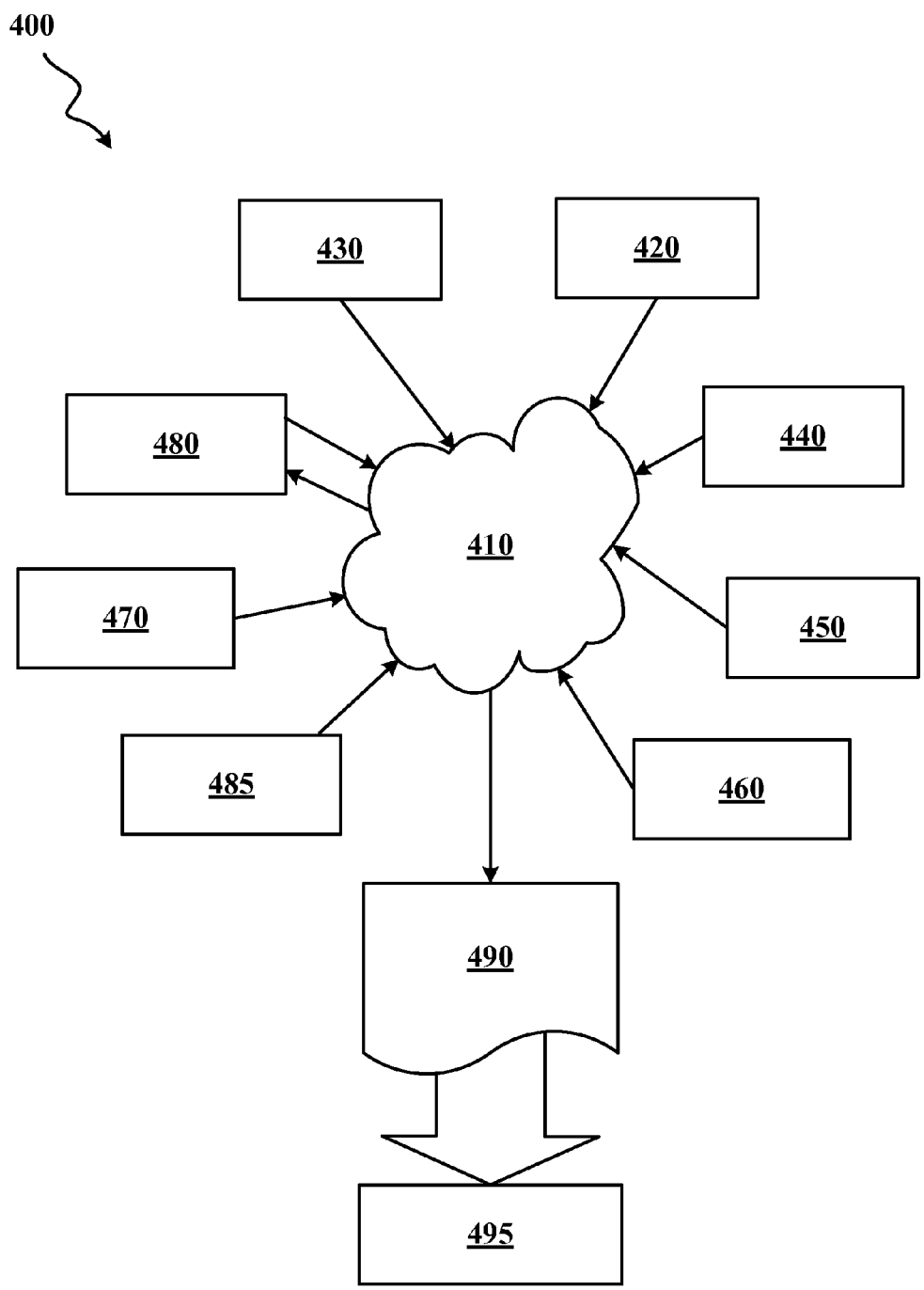
FIG. 4 illustrates multiple design structures including an input design structure that is preferably processed by a design process.

FIG. 4 illustrates multiple design structures 400 including an input design structure 420 that is preferably processed by a design process. Design structure 420 may be a logical simulation design structure generated and processed by design process 410 to produce a logically equivalent functional representation of a hardware device. Design structure 420 may alternatively include data or program instructions that, when processed by design process 410, generate a functional representation of the physical structure of a hardware device. Whether representing functional or structural design features, design structure 420 may be generated using electronic computer-aided design, such as that implemented by a core developer/designer. When encoded on a machine-readable data transmission, gate array, or storage medium, design structure 420 may be accessed and processed by one or more hardware or software modules within design process 410 to simulate or otherwise functionally represent an electronic component, circuit, electronic or logic module, apparatus, device, or system such as those shown in FIG. 1, FIG. 1A and FIG. 3. As such, design structure 420 may include files or other data structures including human or machine-readable source code, compiled structures, and computer-executable code structures that, when processed by a design or simulation data processing system, functionally simulate or otherwise represent circuits or other levels of hardware logic design. Such data structures may include hardware-description language design entities or other data structures conforming to or compatible with lower-level HDL design languages such as Verilog and VHDL, or higher level design languages such as C or C++.

Design process 410 preferably employs and incorporates hardware or software modules for synthesizing, translating, or otherwise processing a design/simulation functional equivalent of the components, circuits, devices, or logic structures shown in FIG. 1, FIG. 1A and FIG. 3 to generate a Netlist 480 which may contain design structures such as design structure 420. Netlist 480 may comprise, for example, compiled or otherwise processed data structures representing a list of wires, discrete components, logic gates, control circuits, I/O devices, models, etc., that describe the connections to other elements and circuits in an IC design. Netlist 480 may be synthesized using an iterative process in which Netlist 480 is resynthesized one or more times depending on design specifications and parameters for the device. As with other design structure types described herein, Netlist 480 may be recorded on a machine-readable data storage medium or programmed into a programmable gate array. The medium may be a non-volatile storage medium such as a magnetic or optical disk drive, a programmable gate array, a compact flash, or other flash memory. Additionally, the medium may be a system or cache memory, buffer space, or electrically or optically conductive devices and materials on which data packets may be transmitted and intermediately stored via the internet, or other suitable networking means.

Design process 410 may include hardware and software modules for processing a variety of input data structure types including Netlist 480. Such data structure types may reside, for example, within library elements 430 and include a set of commonly used elements, circuits, and devices, including models, layouts, and symbolic representations, for a given manufacturing technology, e.g., different technology nodes, 32 nm, 45 nm, 90 nm, etc. The data structure types may further include design specifications 440, characterization data 450, verification data 460, design rules 470, and test data files 485 which may include input test patterns, output test results, and other testing information. Design process 410 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 410, without deviating from the scope and spirit of the invention. Design process 410 may also include modules for performing standard circuit design processes such as timing analysis, verification, design rule checking, place and route operations, etc.

Design process 410 employs and incorporates logic and physical design tools such as HDL compilers and simulation model build tools to process design structure 420 together with some or all of the depicted supporting data structures, along with any additional mechanical design or data, to generate a second design structure 490. Design structure 490 resides on a storage medium or programmable gate array in a data format used for the exchange of data of mechanical devices and structures (e.g., information stored on an IGES, DXF, Parasolid XT, JT, DRG, or any other suitable format for storing or rendering such mechanical design structures). Similar to design structure 420, design structure 490 preferably comprises one or more files, data structures, or other computer-encoded data or instructions that reside on transmission or data storage media and that, when processed by an ECAD system, generate a logically or otherwise functionally equivalent form of one or more of the embodiments of the disclosure shown in FIG. 1, FIG. 1A and FIG. 3. In one embodiment, design structure 490 may comprise a compiled, executable HDL simulation model that functionally simulates the devices shown in FIG. 1, FIG. 1A and FIG. 3.

Design structure 490 may also employ a data format used for the exchange of layout data of ICs and/or symbolic data format (e.g., information stored in a GDSII, GL1, OASIS, map files, or any other suitable format for storing such design data structures). Design structure 490 may comprise information such as symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1, FIG. 1A and FIG. 3. Design structure 490 may then proceed to a state 495 where, for example, design structure 490 proceeds to tape-out, is released to manufacturing, is released to a mask house, is sent to another design house, is sent back to the customer, etc.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method for fabricating, within an integrated circuit (IC), a capacitor, the method comprising:
    creating, in a top surface of a dielectric layer of the IC, a recess having at least one side and a bottom, the bottom adjacent to a first conductive structure;
    forming a first plate of the capacitor by depositing a first conductive liner onto the at least one side and the bottom of the recess;
    depositing a conformal dielectric film onto the first plate within the recess and covering the entire upper surface of the dielectric layer, the conformal dielectric being $HfO_2$ and having a dielectric constant between 7.5 and 28; and
    forming a second plate of the capacitor by completely covering a portion of the conformal dielectric film within the recess with an electrically conductive material that is electrically insulated, by the conformal dielectric film, from the first plate; and
    wherein the second plate is planar with the uppermost surface of the conformal dielectric film.

2. The method of claim 1, wherein the depositing of the first conductive liner comprises removing a portion of the first conductive liner deposited on the top surface of the dielectric layer.

3. The method of claim 2, further comprising depositing, in the recess, photomask material prior to the removing the portion of the first conductive liner deposited on the top surface of the dielectric layer.

4. The method of claim 2, wherein the portion of the first conductive liner deposited on the top surface of the dielectric layer is removed through a chemical-mechanical polishing (CMP) process.

5. The method of claim 2, wherein the portion of the first conductive liner deposited on the top surface of the dielectric layer is removed through an anisotropic etch process.

6. The method of claim 1, wherein the depositing of the first conductive liner further comprises removing a portion of the first conductive liner deposited onto the bottom of the recess.

7. The method of claim 6, wherein the portion of the first conductive liner deposited onto the bottom of the recess is removed through an anisotropic etch process.

8. The method of claim 1, wherein the forming of the second plate of the capacitor comprises forming a second conductive liner onto the conformal dielectric film.

9. The method of claim 1, further comprising depositing a second electrically conductive material onto a top surface of the second plate of the capacitor to form a second conductive structure.

10. The method of claim 1, wherein the creating the recess includes use of a process selected from the group consisting of dry etching, plasma etching, anisotropic etching and reactive ion etching.

11. The method of claim 1, wherein the depositing the conformal dielectric film includes use of a process selected from the group consisting of plasma oxidation, chemical vapor deposition (CVD) and plasma-enhanced chemical vapor deposition (PECVD).

12. The method of claim 1, wherein the filling the portion of the recess with the electrically conductive material includes use of the process selected from the group consisting of physical vapor deposition, cathodic arc deposition and chemical vapor deposition.

* * * * *